United States Patent
Lindstedt

(10) Patent No.: US 7,349,283 B2
(45) Date of Patent: Mar. 25, 2008

(54) INTEGRATED SEMICONDUCTOR MEMORY

(75) Inventor: Reidar Lindstedt, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 11/347,566

(22) Filed: Feb. 6, 2006

(65) Prior Publication Data

US 2006/0176752 A1   Aug. 10, 2006

(30) Foreign Application Priority Data

Feb. 4, 2005  (DE) .................. 10 2005 005 301

(51) Int. Cl.
*G11C 7/00* (2006.01)
(52) U.S. Cl. ............ 365/226; 365/189.07; 365/189.01; 365/201; 365/207
(58) Field of Classification Search ................ 365/226, 365/189.07, 189.01, 201, 207
See application file for complete search history.

(56) References Cited

U.S. PATENT DOCUMENTS

| 6,285,622 B1* | 9/2001 | Haraguchi et al. .......... 365/226 |
| 6,696,828 B2* | 2/2004 | Yoshizawa ............... 324/76.53 |
| 6,795,355 B2 | 9/2004 | Ooishi |
| 2006/0049817 A1* | 3/2006 | Gerstmeier et al. ......... 323/313 |

\* cited by examiner

*Primary Examiner*—Connie C. Yoha
(74) *Attorney, Agent, or Firm*—Edell, Shapiro & Finnan, LLC

(57) ABSTRACT

An integrated semiconductor memory includes a test mode control circuit and at least one voltage generator for generating an operating voltage that is fed into memory banks via interconnects. Comparator circuits are arranged at locations along the respective interconnects, but preferably at the end of each interconnect. The comparator circuits compare a voltage level on the interconnects with a level of a reference voltage. In a manner dependent on the level comparison, the test mode control circuit generates evaluation signals at contact pads. The reference voltage is fed in via a monitor pad. Using the contact pads, which are generally formed with a large area, the evaluation signals can easily be tapped off by a tester.

16 Claims, 3 Drawing Sheets

INTEGRATED SEMICONDUCTOR MEMORY

CROSS REFERENCE TO RELATED APPLICATIONS

This application claims priority under 35 USC §119 to German Application No. DE 10 2005 005301.7, filed on Feb. 4, 2005, and titled "Integrated Semiconductor Memory," the entire contents of which are hereby incorporated by reference.

FIELD OF THE INVENTION

The invention relates to an integrated semiconductor memory in which an internal operating voltage is generated by a voltage generator.

BACKGROUND

In integrated semiconductor memories on a semiconductor chip, for example DRAM (dynamic random access memory) semiconductor memories, voltage generators are generally used for generating internal operating voltages of the integrated semiconductor memory. Thus, a stabilized internal operating voltage is generated from a supply voltage fed externally to the integrated semiconductor memory. Further operating voltages are derived from the stabilized internal operating voltage. In the case of a DRAM semiconductor memory, they are for example voltages which are used for turning on and turning off selection transistors of a memory cell array. The derived operating voltages are fed from the voltage generators via interconnects to circuit components of the semiconductor memory, such as, for example, a memory bank or the word lines or selection transistors of the memory bank.

However, voltage fluctuations may occur along the interconnects of such devices due to the design, fabrication (e.g., mask and lithography processes), and operation of the semiconductor chip. Thus, by way of example, fluctuations within the technology processes lead to location-dependent voltage fluctuations on a semiconductor chip. Decreasing feature sizes result in capacitive coupling effects between spatially closely arranged interconnects, which likewise bring about voltage fluctuations along an interconnect. Consequently, operating voltages that are generated by the same voltage generator have level fluctuations in an internal voltage network into which they are fed by the voltage generator. The level fluctuations of voltages occur both within a single memory bank and between different memory banks into which the voltages are fed. These fluctuations usually occur at some distance from the voltage generator that generates them, for example at the end of an interconnect. Since the transistor operating points, for example the operating points of selection transistors within a memory bank, are designed only for small voltage ranges, even small changes in the voltages across the chip have a great impact on the functionality. As a result, clusters of errors occur at specific places in the semiconductor chip. These errors may be eliminated for example after improving connecting lines.

In the case of so-called pico-probing, the voltage at a location on an interconnect is tapped off by fine contact needles of a measuring system. With this type of measurement, however, many errors can corrupt the result of the measurement. Moreover, the fine positioning and alignment of the contact needles on an interconnect is generally associated with a very great expenditure of time. Greater statistics with which measurement errors can be delimited cannot be achieved on account of the time-consuming measurement method. Furthermore, the pico-probing method can be employed only at the wafer level on specific analysis test systems, since it is only here that direct contact can be made with interconnects. At the packaged device, by contrast, there is currently no possibility of measuring voltages that have been generated by a voltage generator at a central location of the integrated semiconductor memory, such as the spine, for example, on interconnects at different places in the chip.

SUMMARY

The present invention specifies an integrated semiconductor memory in which an internal voltage of the integrated semiconductor memory, which is generated by a voltage generator and is distributed via an internal voltage network within the integrated semiconductor memory, can be determined in a simple manner at different places in the internal voltage network. Further, the present invention specifies a method by which an internal voltage of the integrated semiconductor memory, which is generated by a voltage generator and is distributed via an internal voltage network within the integrated semiconductor memory, can be determined in a simple manner at different places in the internal voltage network.

In accordance with an exemplary embodiment of the present invention, an integrated semiconductor memory includes: contact terminals, a first voltage generator for generating a first operating voltage, and at least one circuit component to which the first operating voltage is fed via a first interconnect. The integrated semiconductor memory further includes first comparator circuits that receive an input voltage and a first reference voltage and generate a first comparison signal, and evaluation logic for generating evaluation signals. The first operating voltage is supplied to one of the first comparator circuits from a first location of the first interconnect. The first operating voltage is supplied to another of the first comparator circuits from a second location of the first interconnect. The first comparator circuits are designed to compare a level of the first operating voltage with a level of the first reference voltage and generate the first comparison signal in a manner dependent on the comparison. The comparison signal from each of the first comparator circuits is supplied to the evaluation logic. The evaluation logic generates evaluation signals each having a first or second state in a manner dependent on the first comparison signals and supplies each of the evaluation signals to one of the contact terminals.

The integrated circuit thus makes it possible to detect voltage levels, in particular undesired voltage fluctuations along an interconnect. If the contact terminal is formed as a terminal pad, the evaluation signals can be tapped off easily by a tester. Impressing the comparison voltage externally has the advantage that there are no restrictions with regard to the value of the comparison voltage, and arbitrary internal voltages can be characterized. The comparator circuits are preferably positioned at locations on a semiconductor memory chip at which voltage fluctuations have a particularly critical effect on the functioning of a semiconductor memory, or else at locations at which voltage deviations from the operating voltage generated by the voltage generator are to be reckoned with.

One development of the integrated semiconductor memory provides a second voltage generator for generating a second operating voltage. The second operating voltage is fed to at least one of the circuit components via a second interconnect. The integrated semiconductor memory furthermore comprises second comparator circuits that each receive an input voltage and a second reference voltage and generate a second comparison signal. The second operating voltage is supplied to one of the second comparator circuits from a first location of the second interconnect. The second operating voltage is supplied to another of the second comparator circuits from a second location of the second interconnect. The second comparator circuits each compare a level of the second operating voltage with a level of the second reference voltage and each generate the second comparison signal in a manner dependent on the comparison. Each of the second comparator circuits supplies the second comparison signal to the evaluation logic, which generates the evaluation signals, each having a first or second state in a manner dependent on the second comparison signals, and supplies each of the evaluation signals to one of the contact terminals.

According to a further feature of the integrated semiconductor memory, the first and the second comparator circuits can be activated. The integrated semiconductor memory furthermore comprises a control logic for activating the first and second comparator circuits and having a control terminal for application of a control signal. The control logic activates the first comparator circuits when driven with a first state of the control signal and activates the second comparator circuits when driven with a second state of the control signal.

In another refinement, the first and second comparator circuits can be activated by being driven with an activation signal. The control logic generates the activation signal and supplies the activation signal to either the first or the second comparator circuits for activation.

In accordance with another variant of the integrated semiconductor memory, the first comparator circuits are activated respectively by being driven with the first reference voltage. Moreover, the second comparator circuits are activated respectively by being driven with the second reference voltage.

In accordance with a method for testing an integrated semiconductor memory, an operating voltage is generated and supplied via an interconnect to a circuit component. The level of the operating voltage prevailing at a first location on the interconnect is compared with a reference voltage, and the level of the operating voltage prevailing at a second location on the interconnect is also compared with the reference voltage. Evaluation signals are then generated at a respective contact terminal of the integrated semiconductor memory with a first state if the level of the operating voltage prevailing at the first and second location on the interconnect lies above the level of the reference voltage. The evaluation signals are generated at a respective contact terminal with a second state if the level of the operating voltage prevailing at the first and second location on the interconnect lies below the level of the reference voltage.

The method according to the invention thus constitutes a direct measurement method which has the advantage that voltage fluctuations on a chip can be characterized and quantified very rapidly on a large statistical database. Many error signatures can thus be elucidated easily and rapidly. A further advantage is that this method can be used during the production sequence in wafer testing technology. This is possible since both the impressing of the reference voltage and the reading of the result can be effected intensively in parallel via a contact terminal, for example a data terminal.

One development of the method for testing the integrated semiconductor memory provides for altering the reference voltage until one of the evaluation signals at one of the contact terminals performs a state change. If the reference voltage is changed in small interval steps, the voltage range within which lies the operating voltage at a measurement location of the interconnect can thus be delimited.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
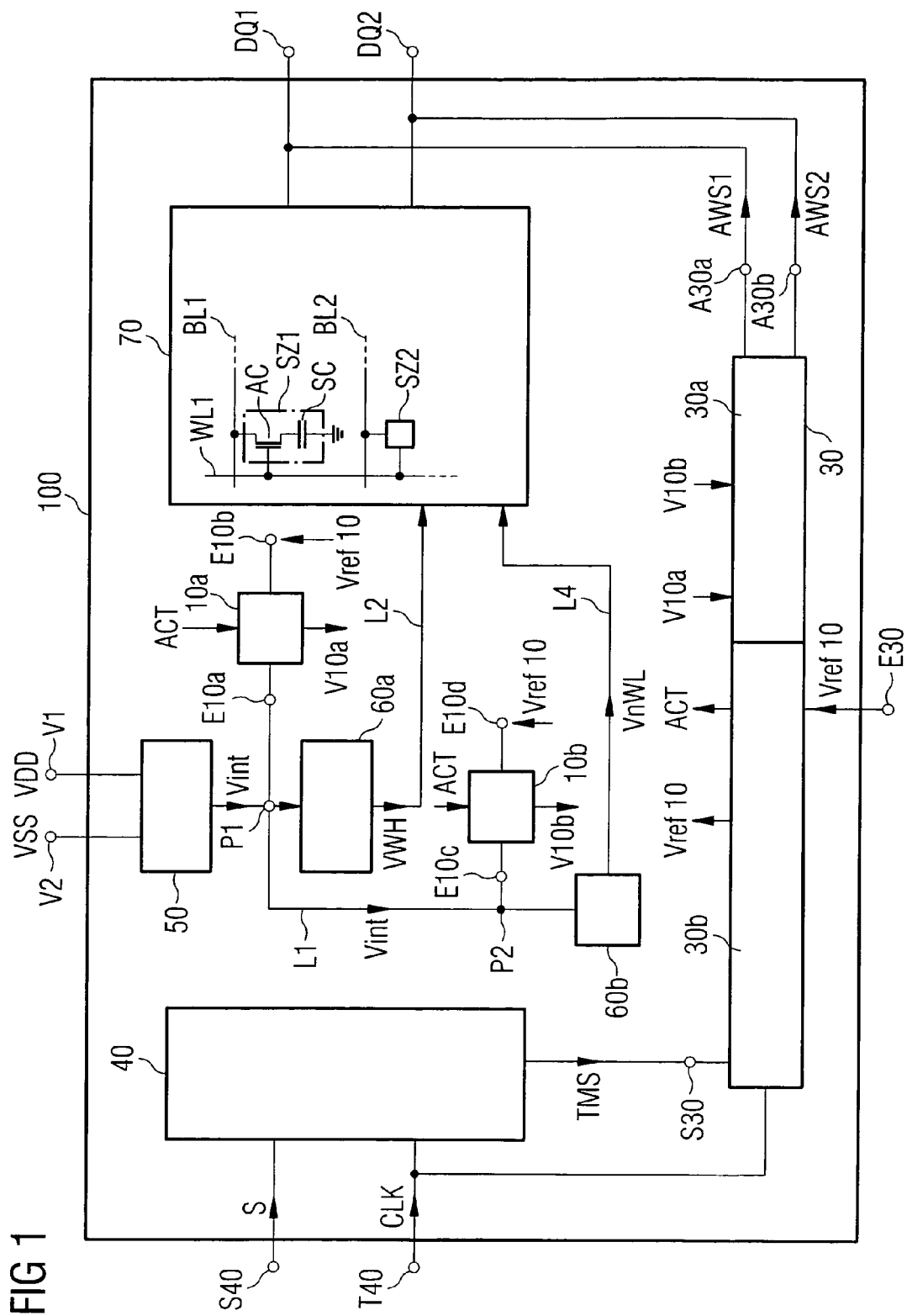
FIG. 1 shows an exemplary embodiment of an integrated semiconductor memory for measuring voltages in an integrated voltage network according to an exemplary embodiment of the invention.

FIG. 1 shows an integrated semiconductor memory 100 having a memory cell array 70, in which memory cells are arranged in matrix-like fashion along word and bit lines. By way of example, memory cells SZ1 and SZ2 are arranged along a word line WL1. The memory cell SZ1 is connected to a bit line BL1, and the memory cell SZ2 is connected to a bit line BL2. The memory cell SZ1 comprises a selection transistor AC and a storage capacitor SC. For accessing a memory cell, the selection transistor is turned on by a corresponding signal on the word line, so that the storage capacitor is connected to the connected bit line in low-resistance fashion via the turned-on path of the selection transistor.

A control circuit 40 is provided for controlling read and write accesses to the memory cell array. The control circuit 40 has a control terminal S40 for application of a control signal S. Read and write accesses to the memory cell array 70 can be controlled by application of a corresponding state of the control signal S. In this case, the integrated semiconductor memory is operated synchronously with the profile of a clock signal CLK applied to a clock terminal T40.

For operating the integrated semiconductor memory, internal stabilized operating voltages are made available by voltage generators. A supply voltage VDD is applied to a supply terminal V1 and a reference voltage VSS, corresponding to a ground potential for example is applied to a supply terminal V2. From the generally unstabilized external supply voltage VDD, a voltage generator 50 generates an internal stabilized operating voltage Vint, which is fed to a voltage generator 60a and a voltage generator 60b on the input side via an interconnect L1. The voltage generator 60a generates an operating voltage VWH on the output side, which operating voltage is fed to the memory cell array 70 via an interconnect L2. The voltage generator 60b generates an operating voltage VnWL on the output side, which operating voltage is fed to the memory cell array 70 via an interconnect L4.

The operating voltage VWH is fed in, for the read-out of memory cells, onto the word line connected to the memory cells to be read. If the selection transistors are formed as n-channel field effect transistors, the operating voltage VWH generally has a high voltage potential in order to control the selection transistors into the conductive state. The operating voltage VnWL is fed in onto one of the word lines of the memory cell array for the purpose of turning off selection transistors. This voltage is generally a negative voltage.

A comparator circuit 10a is arranged at the start of the interconnect L1. Comparator circuit 10a has an input terminal E10a for application of the operating voltage Vint and an input terminal E10b for application of a reference voltage Vref10. The comparator circuit 10a compares a level of the operating voltage Vint prevailing at the start of the interconnect L1, at a location P1, with a level of the reference voltage Vref10 and generates a comparison signal V10a on the output side in a manner dependent on the comparison of the two voltage levels. If, by way of example, the level of the operating voltage lies above the level of the reference voltage, the comparator circuit 10a generates the comparison signal V10a having a first state. If, by contrast, the level of the operating voltage lies below the level of the reference voltage, the comparator circuit 10a generates the comparison signal V10a having a second state.

A comparator circuit 10b is arranged at the end of the interconnect L1. The potential of the operating voltage Vint prevailing at the end of the interconnect L1, at a location P2, is fed to an input terminal E10c of the comparator circuit 10b. The reference voltage Vref10 is fed to the comparator circuit 10b at an input terminal E10d. The comparator circuit 10b compares the level of the operating voltage Vint prevailing at the end of the interconnect L1 with the level of the reference voltage Vref10. The comparator circuit 10b generates a comparison signal V10b on the output side in a manner dependent on the comparison of the two voltage levels. If, by way of example, the level of the operating voltage lies above the level of the reference voltage, the comparator circuit 10b generates the comparison signal V10b having a first state. If, by contrast, the level of the operating voltage lies below the level of the reference voltage, the comparator circuit 10b generates the comparison signal V10b having a second state.

For performing the voltage comparison, the comparator circuits 10a and 10b can be activated by driving with an activation signal ACT.

The integrated semiconductor memory furthermore has a test mode control circuit 30. The reference voltage Vref10 is fed to an input terminal E30 of the test mode control circuit 30. The test mode control circuit comprises an evaluation logic 30a and also a control logic 30b.

The control logic 30b is driven by a test mode control signal TMS at a control terminal S30. In response to being driven with the test mode control signal TMS, control logic 30b generates the reference voltage Vref10 on the output side, the reference voltage Vref10 being fed to the input terminal E10b of the comparator circuit 10a and the input terminal E10d of the comparator circuit 10b. Equally, in response to being driven with the test mode control signal TMS, control logic 30b generates the activation signal ACT, which activates the comparator circuits 10a and 10b.

The comparison signal V10a of the comparator circuit 10a and the comparison signal V10b of the comparator circuit 10b are fed to the evaluation logic 30a. If the evaluation logic 30a is driven by a high level of the comparison signal V10a, evaluation logic 30 generates at its output terminal A30a a first evaluation signal AWS1 having a first logic level, which is fed to the contact terminal DQ1. If, by contrast, evaluation logic 30a is driven with a low level of the comparison signal V10a, evaluation logic 30 generates at its output terminal A30a the first evaluation signal AWS1 having a second logic level. If the test mode control circuit 30 (specifically, evaluation logic 30a) is driven by a high level of the comparison signal V10b, it generates at its output terminal A30b the second evaluation signal AWS2 having a first logic level, which is fed to the contact terminal DQ2. If, by contrast, evaluation logic 30a is driven by a low level of the comparison signal V10b, it generates at its output terminal A30b the second evaluation signal AWS2 having a second logic level.

The comparator circuits 10a and 10b are generally formed as differential amplifier circuits. The evaluation logic 30a converts the states of the comparison signals into signal levels of the evaluation signals AWS1 and AWS2 which correspond to specified data levels of data signals at the data terminals DQ1 and DQ2. In addition, the evaluation logic 30a performs a temporal averaging of the comparison signals V10a and V10b. For this purpose, the clock signal CLK is fed to the test mode control circuit 30. The evaluation logic 30a generates, on the output side, the evaluation signal AWS1 and AWS2 after activation of the comparator circuits after a specific number of clock cycles. After the number of clock cycles has elapsed, the comparator circuits are in a settled state.

The control circuit 40 is driven by the control signal S at its control terminal S40. Besides the control of read and write accesses, it is possible, through the application of a defined state of the control signal S, for example of a characteristic bit sequence, to start a test mode for the activation of the comparator circuits 10a and 10b via the test mode control circuit 30. If the control circuit 40 is driven with a test mode state of the control signal S, then it generates the test mode control signal TMS on the output side, which signal activates the test mode control circuit 30. The control logic 30b thereupon drives the comparator circuits 10a and 10b with the reference signal Vref10 and the activation signal ACT.

There is the possibility of measuring the operating voltage Vint in a so-called power-down state of the integrated semiconductor memory and also in active operation of the integrated semiconductor memory. In the power-down state of the integrated semiconductor memory, no read and write accesses to the memory cell array take place. The semiconductor memory is thus in a quiescent state in which only specific operating voltages are active. Thus, in the power-down state, the operating voltage VWH for turning on the selection transistors of memory cells is not fed in onto the word lines of the memory cell array. Instead, all the selection transistors are turned off by driving with the voltage VnWL. The operating voltage Vint of the voltage generator 50 can also furthermore be evaluated by the comparator circuits 10a and 10b.

During an analysis of internal voltages in the activated state of the semiconductor memory, information items are read into and out of the memory cell array 70. The comparator circuits 10a and 10b can thus establish whether fluctuations of the internal operating voltage Vint occur in the activated state of the semiconductor memory in comparison with the power-down state of the semiconductor memory.

In order to determine the level of the operating voltage Vint, the level of the reference voltage Vref10 is altered temporally. If, by way of example, an applied level of the reference voltage Vref10 is chosen in such a way that the first evaluation signal AWS1 having the first logic state is generated at the contact terminal DQ1, then the level of the operating voltage prevailing at the start of the interconnect L1 lies above the level of the reference voltage. The level of the reference voltage Vref10 is thereupon altered until the first evaluation signal AWS1 having the second level is generated at the contact terminal DQ1. This state of the first evaluation signal indicates that the level of the operating voltage Vint prevailing at the start of the interconnect L1 lies below the level of the reference voltage Vref10. The reference signal Vref10 is preferably altered in specific interval steps. Consequently, it is possible to obtain information about the interval range within which the actual voltage lies at the start of the interconnect L1. By refining the interval steps, the operating voltage to be determined can be determined in a narrow tolerance range.

Figure 2:
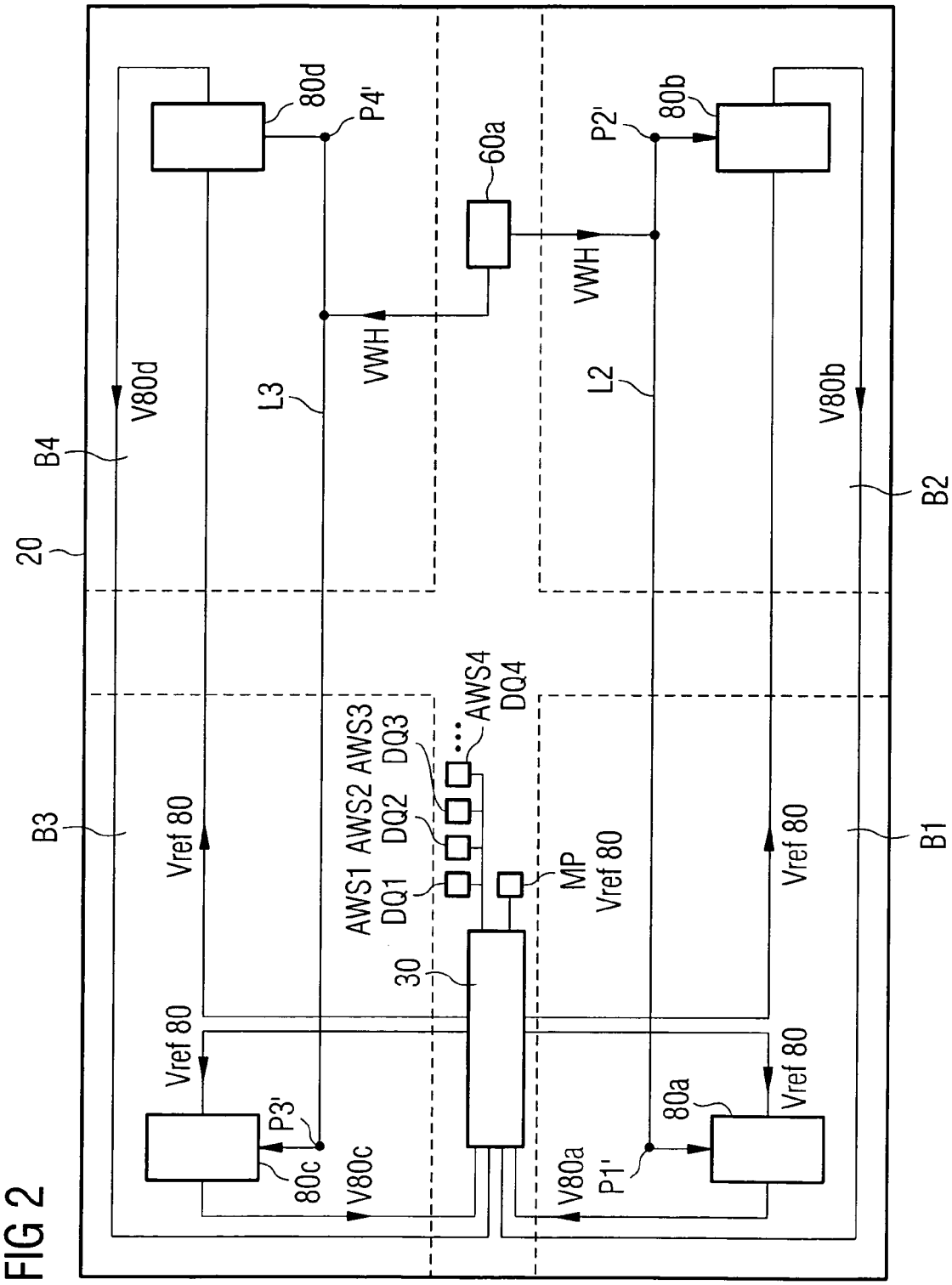
FIG. 2 shows an arrangement of circuit components for determining voltages in an internal voltage network of a semiconductor memory on a semiconductor chip according to an exemplary embodiment of the invention.

Besides the operating voltage Vint, it is also possible, of course, to determine the operating voltages VWH and VnWL using suitable comparator circuits. FIG. 2 shows a semiconductor chip 20 in which the operating voltage VWH can be determined at different locations of the semiconductor chip. For the sake of better clarity, from the circuit components of FIG. 1, only the test mode control circuit 30 and the voltage generator 60a are illustrated. The test mode control circuit 30 is arranged in the so-called spine region of the semiconductor chip. The voltage generator 60a feeds the operating voltage VWH generated by it for turning on selection transistors via an interconnect L2 to a memory bank B1 and a memory bank B2. The operating voltage VWH is fed to a memory bank B3 and a memory bank B4 via an interconnect L3. Within the memory banks, comparator circuits 80a, 80b, 80c and 80d are arranged at the end of the respective interconnects at locations P1', P2', P3' and P4'. A reference voltage Vref80 is in each case fed to the comparator circuits by the test mode control circuit 30.

The comparator circuits 80a, 80b, 80c and 80d compare the levels of the operating voltage VWH that are respectively fed to them via the interconnects with the level of the reference voltage Vref80 that is respectively fed to them. The comparator circuit 80a generates the comparison signal V80a on the output side after a comparison of the level of the operating voltage VWH which prevails at the location P1' at the end of the interconnect L1 with the level of the reference voltage Vref80. The comparator circuit 80b generates the comparison signal V80b after a comparison of the operating voltage VWH which prevails at the location P2' at the end of the interconnect L2 with a level of the reference voltage Vref80. The comparator circuit 80c generates the comparison signal V80c after a comparison of the level of the operating voltage VWH which prevails at the location P3' at the end of the interconnect L3 with a level of the reference voltage Vref80. The comparator circuit 80d generates the comparison signal V80d after a comparison of the level of the operating voltage VWH which prevails at the location P4' at the end of the interconnect L4 with a level of the reference voltage Vref80.

The comparison signals V80a, V80b, V80c and V80d are fed to the test mode control circuit 30. After a temporal averaging of the comparison signals, a logic level of an evaluation signal AWS1 which specifies the state of the comparison signal V80a is generated at a contact pad DQ1. A logic level of an evaluation signal AWS2 which specifies the state of the comparison signal V80b is generated at a contact pad DQ2. A logic state of an evaluation signal AWS3 which specifies the state of the comparison signal V80c is generated at a contact pad DQ3. A logic state of an evaluation signal AWS4 which corresponds to the state of the comparison signal V80d is generated at a contact pad DQ4.

The reference voltage Vref80 is fed to the test mode control circuit 30 via a monitor pad MP. The contact pads DQ1, DQ2, DQ3 and DQ4 are preferably formed as data terminal pads. They are connected to the external component pins of the semiconductor component via bonding wires (not illustrated in FIG. 2) in the later production process. Using large-area metallic pads, the reference voltage Vref80 can be fed in at the monitor pad MP in a simple manner and the evaluation signals AWS1, AWS2, AWS3 and AWS4 can likewise be tapped off in a simple manner at the contact pads DQ1, DQ2, DQ3 and DQ4. The states of the evaluation signals generated at the contact pads DQ1, DQ2, DQ3 and DQ4 provide information about how the voltage level of the operating voltage VWH within the memory banks B1, B2, B3 and B4 compares with the level of the reference voltage Vref80.

Figure 3:
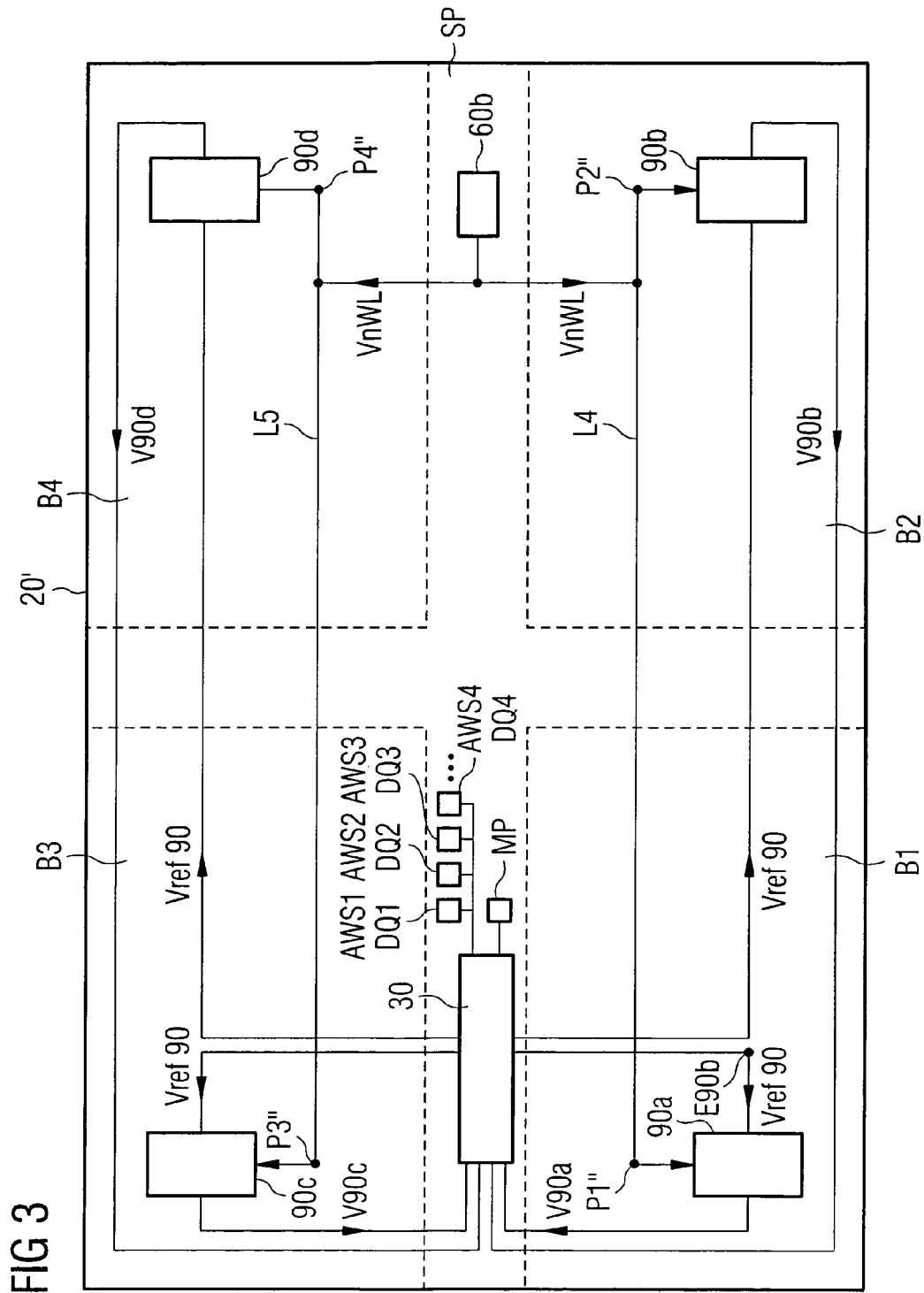
FIG. 3 shows a further arrangement of circuit components of an integrated semiconductor memory for determining voltages in an internal voltage network of a semiconductor memory on a semiconductor chip according to an exemplary embodiment of the invention.

FIG. 3 shows a further semiconductor memory chip 20', which likewise comprises four memory banks B1, B2, B3 and B4. The test mode control circuit 30, the contact pads DQ1, DQ2, DQ3 and DQ4 and also the monitor pad MP are once again illustrated in the spine SP of the semiconductor chip 20'. Furthermore, the voltage generator 60b for generating the operating voltage VnWL is arranged in the spine region.

The operating voltage VnWL generated by the voltage generator 60b is fed to the memory banks B1, B2, B3 and B4 via interconnects L4 and L5. Comparator circuits 90a, 90b, 90c and 90d are in each case arranged at the end of the interconnects. The comparator circuits in each case compare, in the activated state, the levels of the operating voltage VnWL at the end of the interconnects at locations P1'', P2'', P3'' and P4'' with the level of a reference voltage Vref90, which is fed to them by the control logic of the test mode control circuit 30. The reference voltage is fed in via the monitor pad MP. The comparator circuits 90a, 90b, 90c and 90d generate comparison signals V90a, V90b, V90c and V90d which are fed to the evaluation logic of the test mode control circuit. The evaluation logic generates the evaluation signals AWS1, AWS2, AWS3 and AWS4 depending on the levels of the comparison signals at the contact terminals DQ1, DQ2, DQ3 and DQ4, which evaluation signals depend on the state of the comparison signals.

The comparator circuits 80a, 80b, 80c and 80d and also the comparator circuits 90a, 90b, 90c and 90d are preferably arranged together on a semiconductor chip. The operating voltage to be monitored is selected via the control signal S. Thus, by way of example, the control signal S having a first test mode state is applied to the control circuit 40 for the purpose of monitoring the operating voltage VWH and the control signal S having a second test mode state is applied to the control circuit 40 for the purpose of monitoring the operating voltage VnWL. If the control circuit 40 is driven by the first test mode state of the control signal S, it generates a state of the test mode control signal TMS such that the control logic 30b activates the comparator circuits 80a, 80b, 80c and 80d. If the control circuit 40 is driven by the second test mode state of the control signal S, it generates a state of the test mode control signal TMS such that the control logic 30b activates the comparator circuits, 90a, 90b, 90c and 90d.

It is also possible that a comparator circuit for monitoring two different operating voltages may be provided. Different operating voltages can then be fed to the same comparator circuit, for example via a control switch. If, for example in FIG. 3, the comparator circuits 90a, 90b, 90c and 90d are used for monitoring the operating voltages VWH, then the control circuit 30 drives the comparator circuits with the reference voltage Vref80. If, by contrast, the operating voltage VnWL is to be monitored, then the same comparator circuits are driven by the reference voltage Vref90.

In the case of the embodiments of the comparator circuits 80 and 90 shown in FIGS. 2 and 3, respectively, the comparator circuits are not activated by an activation signal ACT, as illustrated in FIG. 1, but rather are activated by the control logic feeding the reference voltage Vref80 and Vref90, respectively, to them.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 Comparator circuit
20 Semiconductor chip
30 Test mode control circuit
30a Control logic
30b Evaluation logic
40 Control circuit
50, 60 Voltage generator
70 Memory cell array
80 Comparator circuit
90 Comparator circuit
100 Semiconductor memory
WL Word line
BL Bit line
SZ Memory cell
V Supply terminal
VDD Supply voltage
VSS Reference voltage
Vint Internal voltage
VWH Word line high voltage
VnwL Word line low voltage
L Interconnect
S Control signal
CLK Clock signal
AC Selection transistor
SC Storage capacitor
DQ Contact terminal, contact pad
AWS Evaluation signal
TMS Test mode control signal
Vref Reference voltage
MP Monitor pad
B Memory bank

What is claimed is:

1. An integrated semiconductor memory, comprising:
a first voltage generator for generating a first operating voltage;
at least one circuit component to which the first operating voltage is supplied via a first interconnect;
a second voltage generator for generating a second operating voltage, wherein the second operating voltage is supplied to the at least one circuit component via a second interconnect;
first comparator circuits, wherein one of the first comparator circuits compares a level of the first operating voltage received from a first location of the first interconnect with a first reference voltage, and another of the first comparator circuits compares a level of the first operating voltage received from a second location of the first interconnect with the first reference voltage, each of the first comparator circuits generating a respective first comparison signal in response to comparison of the level of the first operating voltage with the first reference voltage;
second comparator circuits, wherein one of the second comparator circuits compares a level of the second operating voltage received from a first location of the second interconnect with a second reference voltage, and another of the second comparator circuits compares a level of the second operating voltage received from a second location of the second interconnect with the second reference voltage, each of the second comparator circuits generating a respective second comparison signal in response to comparison of the level of the second operating voltage with the second reference voltage;
evaluation logic configured to generate evaluations signals each having a first or second state, wherein the evaluation logic controls states of the evaluation signals as a function of the respective first comparison signals in response to receiving the first comparison signals from the first comparator circuits and wherein, in response to receiving the respective second comparison signals, the evaluation logic generates the evaluation signals such that the states of the evaluation signals are a function the respective second comparison signals; and
contact terminals configured to receive the evaluation signals.

2. The integrated semiconductor memory of claim 1, further comprising:
control logic for activating the first and second comparator circuits in response to receipt of a control signal, wherein the control logic activates the first comparator circuits in response to the control signal having a first state, and activates the second comparator circuits in response to the control signal having a second state.

3. The integrated semiconductor memory of claim 2, wherein the control logic selectively activates the first and second comparator circuits by supplying an activation signal to the first comparator circuits or to the second comparator circuits.

4. The integrated semiconductor memory of claim 3, wherein the first comparator circuits are activated by being driven with the first reference voltage, and the second comparator circuits are activated by being driven with the second reference voltage.

5. The integrated semiconductor memory of claim 2, wherein:
in response to the first state of the control signal, the control logic supplies the first reference voltage to the first comparator circuits; and
in response to the second state of the control signal, the control logic supplies the second reference voltage to the second comparator circuits.

6. The integrated semiconductor memory of claim 2, wherein:
the evaluation logic generates the evaluation signals with a first state in response to the control logic being driven with the first state of the control signal and the level of the first operating voltage lying above the level of the first reference voltage;

the evaluation logic generates the evaluation signals with a second state in response to the control logic being driven with the first state of the control signal and the level of the first operating voltage lying below the level of the first reference voltage;

the evaluation logic generates the evaluation signals with a first state in response to the control logic being driven with the second state of the control signal and the level of the second operating voltage lying above the level of the second reference voltage; and the evaluation logic generates the evaluation signals with a second state in response to the control logic being driven with the second state of the control signal and the level of the second operating voltage lying below the level of the second reference voltage.

7. The integrated semiconductor memory of claim 1, wherein the integrated semiconductor memory is operated synchronously with the profile of a clock signal, and the evaluation logic generates the evaluation signals after a number of clock periods of the clock signal that follow activation of the first or second comparator circuits have elapsed.

8. The integrated semiconductor memory of claim 1, wherein the first comparator circuits are arranged in the vicinity of the first interconnect, and the second comparator circuits are arranged in the vicinity of the second interconnect.

9. The integrated semiconductor memory of claim 1, wherein:

the first location of the first interconnect lies at the start of the first interconnect;

the second location of the first interconnect lies at the end of the first interconnect;

the first location of the second interconnect lies at the start of the second interconnect; and the second location of the second interconnect lies at the end of the second interconnect.

10. The integrated semiconductor memory of claim 1, wherein the first and second comparator circuits comprise differential amplifiers.

11. The integrated semiconductor memory of claim 1, wherein the contact terminals comprise contact pads on a semiconductor chip for generating data.

12. The integrated semiconductor memory of claim 1, wherein the second voltage generator generates a control voltage for turning on selection transistors of a memory cell array.

13. The integrated semiconductor memory of claim 1, wherein the second voltage generator generates a control voltage for turning off selection transistors of a memory cell array.

14. A method for testing an integrated semiconductor memory, comprising:

generating an operating voltage within the integrated semiconductor memory;

supplying the operating voltage to a circuit component of the integrated semiconductor memory via an interconnect;

comparing a level of the operating voltage prevailing at a first location on the interconnect with a reference voltage;

comparing a level of the operating voltage prevailing at a second location on the interconnect with the reference voltage;

generating a first evaluation signal at a first contact terminal of the integrated semiconductor memory, the first evaluation signal having a first state in response to the level of the operating voltage prevailing at the first location on the interconnect lying above the reference voltage and having a second state in response to the level of the operating voltage prevailing at the first location on the interconnect lying below the reference voltage; and generating a second evaluation signal at a second contact terminal of the integrated semiconductor memory, the second evaluation signal having a first state in response to the level of the operating voltage prevailing at the second location on the interconnect lying above the reference voltage and having a second state in response to the level of the operating voltage prevailing at the second location on the interconnect lying below the reference voltage.

15. The method of claim 14, further comprising:

altering the reference voltage until at least one of the evaluation signals at one of the contact terminals performs a state change.

16. The method of claim 14, further comprising:

performing a read and write access to memory cells of the integrated semiconductor memory; and comparing the operating voltage prevailing at the first and second locations on the interconnect with the reference voltage while performing the read and write access.

* * * * *